United States Patent [19]

Osenegg

[11] Patent Number: 5,053,313

[45] Date of Patent: Oct. 1, 1991

[54] PROCESS FOR PERFORMING PRE-PRESS COLOR PROOFING PROCESSES

[75] Inventor: Carlfried W. Osenegg, Neunkirchen-Seelscheid, Fed. Rep. of Germany

[73] Assignee: E. I. du Pont de Nemours Company, Wilmington, Del.

[21] Appl. No.: 411,455

[22] PCT Filed: Mar. 16, 1988

[86] PCT No.: PCT/EP88/00211

§ 371 Date: Sep. 14, 1989

§ 102(e) Date: Sep. 14, 1989

[87] PCT Pub. No.: WO88/07223

PCT Pub. Date: Sep. 22, 1988

[30] Foreign Application Priority Data

Mar. 17, 1987 [DE] Fed. Rep. of Germany ....... 3708586

[51] Int. Cl.$^5$ ............................................. G03C 11/12
[52] U.S. Cl. .................................... 430/257; 430/256; 430/291
[58] Field of Search ............... 430/257, 260, 261, 262, 430/263, 291, 358, 293, 292, 256

[56] References Cited

U.S. PATENT DOCUMENTS

| | | | |
|---|---|---|---|
| 3,156,565 | 9/1962 | Sinclair | 430/262 |
| 3,649,268 | 3/1972 | Chu et al. | 430/291 |
| 4,329,420 | 5/1982 | Bopp | 430/293 |
| 4,461,822 | 7/1984 | Abele | 430/293 |
| 4,921,776 | 5/1990 | Taylor, Jr. | 430/293 |

*Primary Examiner*—Charles L. Bowers, Jr.
*Assistant Examiner*—John S. Y. Chu

[57] ABSTRACT

The method and means for carrying out pre-press color proofing processes for color press printing, wherein at least one photosensitive film is laminated onto a sample of the paper intended to be used for the final press printing, which sample has been removably applied to a shape-stable and dimensionally stable support, exposed to light, and colored with a dry toner, characterized in that an interlayer which can be stripped from the support without damage has been applied in advance on the reverse side of the paper intended to be used for the final press printing.

27 Claims, No Drawings

PROCESS FOR PERFORMING PRE-PRESS COLOR PROOFING PROCESSES

PRIORITY

This application draws priority from German Application P 37 08 586.7 filed Mar. 17, 1987, and from PCT/EP 88/00211, filed Mar. 16, 1988, which are incorporated herein by reference.

The present invention relates to a method and means for carrying out pre-press or off-press color proofing procedures for color printing, wherein at least one photosensitive film is laminated onto a substrate or receptor, exposed to light, and toned or colored with a dry toner.

Such pre-press color proofing procedures for color printing are to an increasing extent displacing the classical proof print (i.e., press proof) in gravure and offset printing. With press proofs there are many factors which affect the print and have to be adjusted to each other. Pre-press color proofing systems require only two factors to be standardized and controlled, i.e., the time of exposure and the process of applying pigment (toner).

These pre-press color proofing systems permit a valid determination to be made as to whether the color separation transparencies (films) are in the optimum condition and which corrections have to be made. In addition, the color proof (test print) is available faster. However, the automatic transportation of the color proof substrate through an automatic toning device demands higher stability than that inherent in the normal paper substrates intended to be used for the final press print. Thus, the proofing procedure is conventionally carried out using a cardboard support instead of the paper that will actually be used in the press print. As a matter of fact, however, such a cardboard support frequently causes the pre-press proof to have a better appearance than will result from the subsequent press printing procedure.

Therefore, many attempts have been made to combine the paper intended to be used for the final press print with a stable support/cardboard. This combination of paper and support is used during the processing from the time the photosensitive film is laminated to a receptor until the film/receptor has passed through the automatic toning apparatus. However, once this procedure is finished, it must be possible to readily remove the paper (with the attached image-bearing film), damage-free, from the support/cardboard. Attempts using support/cardboards having a coating of an adhesive with low adhesive power have not proven to be successful and feasible, since variations in the adhesive power, and in the resistance of the paper to pulling, have again and again caused failures to occur. In practice, attempts were made to remedy this problem by coating the edges of the support/cardboard with a sizing or glue, or by bonding the paper intended to be used for the final press print onto the cardboard using double-sided adhesive tape. This manual step and, above all, the unsteady securing of registration during multiple color transfers are disadvantages of this method.

It is the object of the invention to develop a method and means for carrying out pre-press color proofing processes for color printing, wherein at least one photosensitive film is laminated onto a substrate, exposed to light, and toned or colored with a dry toner, and to permit a sample of the paper intended to be used for the final press print to be used as the film substrate. More particularly, it is intended that the process and product will be as acceptable technically as when a stable support/cardboard is used as the substrate.

This object can be attained in a surprisingly simple way by applying an interlayer to the reverse side of a sample of the paper intended to be used for the final press print. This interlayer must permit the paper to be stripped, without damage, from the shape-stable and dimensionally stable support.

Thus, the means comprise:

a) a sample of the paper intended to be used for the final press print, which paper has been pre-treated in advance on the reverse side as defined herein, and, b) a shape-stable and dimensionally stable support which has been pre-treated as defined herein, to the surface of which said paper has been removably applied.

The reverse side of the paper intended to be used for the final press print is pre-treated in a defined manner, for example, by treating it with a pore-closing release coating which forms an adhesive-repelling surface. Said release coating is preferably applied from organic solvents, and contains, for example, PE (polyethylene), PVDC (poly(vinylidene dichloride)), PU (polyurethane), polyester, or silicones, as the adhesive-repelling component. Because of the use of organic solvents, this method is particularly recommended for commercial manufacture, employing several standardized and frequently used printing papers.

When more infrequently used printing papers are employed, there is the option to laminate to the desired printing paper a one-sided self-adhesive film without using an organic solvent. Such one-sided self-adhesive films are already commercially available and are offered, for example, by the company Neschen (West Germany).

As a further method for providing the defined pre-treatment, a heat-sealing film may be heat laminated to the reverse side of the desired paper. However, in this procedure care must be taken to assure that the quality of the printing paper will not be affected by the hot lamination.

The surface of the support/cardboard is also pre-treated as defined herein, for example, by covering it with a weak pressure-sensitive adhesive. A further possibility is to cover the surface of the support with an adhesive film. The above-described pre-treated papers must also sufficiently adhere to such adhesive films so that the subsequent process steps, i.e., laminating, exposing to light, and toning, can be carried out faultlessly, and so that, finally, the proof print on a sample of the desired paper can be readily stripped from the support. The pre-press color proofs made in this manner conform fully to the final press printed products and are not falsely affected by the different paper characteristics of the cardboard, as may occur in conventional proofing methods.

The shape-stable and dimensionally stable supports having a surface pre-treated in the defined manner may include the conventionally used cardboards, so long as they meet the requirements set as to weight, thickness and stability of the support. However, it is no longer necessary to coat them in a special manner as was usual for the proof cardboard used until now.

A further option, according to the invention, comprises using as the support sheet a film, made from, e.g., polyester, which is stable with respect to shape and dimensions and onto which either the weak pressure-sensitive adhesive, but more especially, an adhesive film, has been applied. Polyester films which are stable with respect to shape and dimensions in general are more expensive than cardboard. However, particularly when coated with an adhesive film, they are not capable of accepting toner so that they can be used repeatedly. This may easily more than overcome the disadvantage in price as compared to cardboard. Thus, such polyester sheets will be used particularly where the paper grades employed will be frequently changed and where from time to time said paper is pre-treated with a one-sided self-adhesive film.

The following tests were carried out with the pre-press color proofing system "Cromalin" ® of the company E. I. du Pont de Nemours and Company/West Germany/USA. For testing, in place of the cardboard Kromekote ® (300 g/m²) conventionally used for proofing, the paper intended to be used for the final press print was used.

EXAMPLES

EXAMPLE 1

Standard types of printing papers were coated on one side with the solution of a release coating, and then applied onto the surface of a cardboard which had been coated with a weak pressure-sensitive adhesive. The photosensitive film was then laminated to this combination, comprising support and printing paper, exposed to light, and toned in the usual manner according to the Cromalin ® process. Then the proof was stripped from the support. It corresponded to the final press-printed products substantially better than did the proofs prepared for comparison on Kromekote ® cardboard.

EXAMPLE 2

As a support, a PTP (polyethylene terephthalate) film of 130 μm in thickness was laminated with a layer of soft PVC (polyvinyl chloride) 200 μm in thickness. Papers pre-treated according to Example 1, as well as other papers which had been covered on their reverse side with a one-sided self-adhesive film of the company Neschen, were adhered to the soft-PVC layer. This support could be used several times without losing its quality or becoming tinted by toner residue. More particularly, in the preparation of several pre-press proofs, much space and weight is saved, as the proofs are only slightly thicker and heavier than the final printed products, while they are substantially thinner and lighter than the previous pre-press proofs prepared on cardboard.

I claim:

1. A method for preparing a pre-press color proof on a paper substrate intended to be used for a color press print, comprising the steps of:
   a) providing a support element comprising a sample of the paper to be used for the press print, said paper having an interlayer applied to the reverse side thereof, and said paper/interlayer being removably attached to a shape-stable and dimensionally stable support, with the interlayer between the paper and support, whereby the paper/interlayer can be stripped from the support without damage;
   b) laminating a tonable photosensitive film to the paper surface of said element;
   c) exposing the photosensitive film to actinic radiation in an imagewise manner;
   d) applying a dry toner to the exposed photosensitive film; and,
   e) stripping the support from the film/paper/interlayer.

2. A method of claim 1, wherein the dry toner is applied by passing the photosensitive film/support element through an automatic toning apparatus.

3. A method of claim 1, wherein after step d), steps b), c), and d) are repeated at least twice, each time exposing with a different color separation image and applying a correspondingly colored dry toner.

4. A method of claim 2, wherein after step d), steps b), c), and d) are repeated at least twice, each time exposing with a different color separation image, and applying a correspondingly colored dry toner.

5. A method of claim 1, wherein the interlayer is a pore-closing release coating which has been applied to the reverse side of the paper sample, and which provides an adhesive-repelling surface.

6. A method of claim 5, wherein the release coating comprises as an adhesive-repelling component polyethylene, poly(vinylidene dichloride), polyurethane, polyester, or a silicone.

7. A method of claim 4, wherein the interlayer is a pore-closing release coating which has been applied to the reverse side of the paper sample, and which provides an adhesive-repelling surface.

8. A method of claim 7, wherein the release coating comprises as an adhesive-repelling component polyethylene, poly(vinylidene dichloride), polyurethane, polyester, or a silicone.

9. A method of claim 1, wherein the interlayer is a one-sided self-adhesive sheet which has been laminated onto the reverse side of the paper sample, with the adhesive side in contact with the reverse side of the paper sample.

10. A method of claim 4, wherein the interlayer is a one-sided self-adhesive sheet which has been laminated onto the reverse side of the paper sample, with the adhesive side in contact with the reverse side of the paper sample.

11. A method of claim 1, wherein the upper surface of the shape-stable and dimensionally stable support has been coated with a layer of a weak pressure-sensitive adhesive.

12. A method of claim 4, wherein the upper surface of the shape-stable and dimensionally stable support has been coated with a layer of a weak pressure-sensitive adhesive.

13. A method of claim 5, wherein the upper surface of the shape-stable and dimensionally stable support has been coated with a layer of a weak pressure-sensitive adhesive.

14. A method of claim 7, wherein the upper surface of the shape-stable and dimensionally stable support has been coated with a layer of a weak pressure-sensitive adhesive.

15. A method of claim 10, wherein the upper surface of the shape-stable and dimensionally stable support has been coated with a layer of a weak pressure-sensitive adhesive.

16. A method of claim 1, wherein the upper surface of the shape-stable and dimensionally stable support has been provided with an adhesive film layer.

17. A method of claim 4, wherein the upper surface of the shape-stable and dimensionally stable support has been provided with an adhesive film layer.

18. A method of claim 5, wherein the upper surface of the shape-stable and dimensionally stable support has been provided with an adhesive film layer.

19. A method of claim 7, wherein the upper surface of the shape-stable and dimensionally stable support has been provided with an adhesive film layer.

20. A method of claim 10, wherein the upper surface of the shape-stable and dimensionally stable support has been provided with an adhesive film layer.

21. A method of claim 1, wherein the support is a polyester sheet.

22. A method of claim 4, wherein the support is a polyester sheet.

23. A method of claim 5, wherein the support is a polyester sheet.

24. A method of claim 7, wherein the support is a polyester sheet.

25. A method of claim 10, wherein the support is a polyester sheet.

26. A method of claim 15, wherein the support is a polyester sheet.

27. A method of claim 17, wherein the support is a polyester sheet.

* * * * *